(12) United States Patent
Cheng et al.

(10) Patent No.: US 9,818,971 B2
(45) Date of Patent: Nov. 14, 2017

(54) OLED DISPLAY DEVICE WITH AUXILIARY ELECTRODE AND PREPARATION METHOD THEREOF, DISPLAY APPARATUS

(71) Applicant: BOE TECHNOLOGY GROUP CO., LTD., Beijing (CN)

(72) Inventors: Hongfei Cheng, Beijing (CN); Yong Qiao, Beijing (CN); Yongchun Lu, Beijing (CN); Jianbo Xian, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/768,956

(22) PCT Filed: Oct. 27, 2014

(86) PCT No.: PCT/CN2014/089550
§ 371 (c)(1),
(2) Date: Aug. 19, 2015

(87) PCT Pub. No.: WO2016/019637
PCT Pub. Date: Feb. 11, 2016

(65) Prior Publication Data
US 2016/0276619 A1    Sep. 22, 2016

(30) Foreign Application Priority Data
Aug. 5, 2014    (CN) .......................... 2014 1 0381736

(51) Int. Cl.
*H01L 51/52*    (2006.01)
*H01L 51/56*    (2006.01)
(Continued)

(52) U.S. Cl.
CPC ...... *H01L 51/5228* (2013.01); *H01L 27/3248* (2013.01); *H01L 27/3262* (2013.01);
(Continued)

(58) Field of Classification Search
None
See application file for complete search history.

(56) References Cited

U.S. PATENT DOCUMENTS

| 6,452,658 | B1 | 9/2002 | Park et al. |
| 7,692,782 | B2 * | 4/2010 | Nolot ...................... C23C 16/44 356/243.1 |

(Continued)

FOREIGN PATENT DOCUMENTS

| CN | 102916030 A | 2/2013 |
| CN | 103413594 A | 11/2013 |
| CN | 103779384 A | 5/2014 |

OTHER PUBLICATIONS

Chinese Office Action in Chinese Application No. 201410381736.8, dated Jun. 22, 2016 with English translation.
(Continued)

Primary Examiner — Michael Jung
(74) Attorney, Agent, or Firm — Collard & Roe, P.C.

(57) ABSTRACT

An organic light emitting diode (OLED) display device and a preparation method thereof, and a display apparatus are disclosed. The OLED display device includes: a thin layer transistor (22), a first electrode (23'), a second electrode (26') and an organic functional layer (25) located between the first electrode (23') and the second electrode (26'). The thin film transistor (22) comprises a gate electrode (221), a source electrode (222) and a drain electrode (223); and the first electrode (23') is electrically connected with the drain electrode (223). The display device further comprises a first auxiliary electrode (27) formed from a topological insulator. The first auxiliary electrode (27) is electrically connected with the second electrode (26') to provide electrical signals for the second electrode (26'). The OLED display avoids the
(Continued)

problems of high IR drop and non-uniform lightness caused by the large transmission resistance of the cathodes.

15 Claims, 3 Drawing Sheets

(51) Int. Cl.
*H01L 27/32* (2006.01)
*H01L 27/12* (2006.01)

(52) U.S. Cl.
CPC ...... H01L 51/5225 (2013.01); H01L 51/5284 (2013.01); H01L 51/56 (2013.01); *H01L 27/1214* (2013.01); *H01L 2227/323* (2013.01); *H01L 2251/301* (2013.01)

(56) References Cited

U.S. PATENT DOCUMENTS

| | | | |
|---|---|---|---|
| 9,024,415 B2 | 5/2015 | Zhang et al. | |
| 2009/0058283 A1* | 3/2009 | Tanaka | H01L 51/5218 313/504 |
| 2011/0031500 A1* | 2/2011 | Suh | H01L 27/3279 257/59 |
| 2013/0287999 A1* | 10/2013 | Cha | B05D 1/00 428/141 |
| 2014/0110680 A1 | 4/2014 | Choe | |
| 2014/0160835 A1 | 6/2014 | Soree et al. | |
| 2015/0021560 A1* | 1/2015 | Jeong | H01L 51/56 257/40 |
| 2015/0034913 A1* | 2/2015 | Yoon | H01L 51/5203 257/40 |
| 2015/0060918 A1* | 3/2015 | Shiobara | C08K 3/0075 257/98 |
| 2015/0144906 A1* | 5/2015 | Ichikawa | H01L 51/5228 257/40 |
| 2016/0308001 A1* | 10/2016 | Yoon | B81C 1/00031 |

OTHER PUBLICATIONS

International Search Report of PCT/CN2014/089550 in Chinese, dated Apr. 29, 2015 with English translation.
Notice of Transmittal of the International Search Report of PCT/CN2014/089550 in Chinese, dated Apr. 29, 2015.
Written Opinion of the International Searching Authority of PCT/CN2014/089550 in Chinese, dated Apr. 29, 2015 with English translation.
Second Chinese Office Action in Chinese Application No. 201410381736.8, dated Feb. 13, 2017 with English translation.
Xu, Yong et al. "Large-Gap Quantum Spin Hall Insulators in Tin Films." Physical Review Letters, 111, 136804 (2013), 5 pages.
Zhang, X. et al., "Actinide Topological Insulator Materials with Strong Interaction." Department of Physics, McCullough Building, Stanford University, Stanford, California 94305-404531—Institut fuer Anorganische Chemie and Analytische Chemie, Johannes Gutenberg—Universitaet, 55099 Mainz, Germany.
Zhang, H. et al. "Quantum Anomalous Hall Effect in Magnetic Topological Insulator GdBiTe3." Department of Physics, McCullough Building, Stanford University, Stanford, CA 94305-4045.

* cited by examiner

OLED DISPLAY DEVICE WITH AUXILIARY ELECTRODE AND PREPARATION METHOD THEREOF, DISPLAY APPARATUS

CROSS REFERENCE TO RELATED APPLICATIONS

This application is the National Stage of PCT/CN2014/089550 filed on Oct. 27, 2014, which claims priority under 35 U.S.C. §119 of Chinese Application No. 201410381736.8 filed on Aug. 5, 2014, the disclosure of which is incorporated by reference.

TECHNICAL FIELD

The embodiments of the present invention relate to an organic light emitting diode (OLED) display device and a preparation method thereof, and a display apparatus.

BACKGROUND

Organic light emitting diode (OLED) display is a new generation of display, in comparison with an liquid crystal display, an OLED display has many advantages, such as self-illumination, rapid response speed, wide viewing angle, etc., and can be used for flexible display, transparency display, 3D display, etc.

An organic light emitting diode comprises an anode, a cathode and an organic functional layer. The main operation principle of the organic light emitting diode is that the current carriers driven by an electric field formed by the anode and the cathode are injected into the organic functional layer and complex therein, thereby emitting light.

SUMMARY

At least one embodiment of the present invention provides an OLED display device and a preparation method thereof, and a display apparatus, thereby overcoming the problems of high internal resistance drop (IR drop) and non-uniform lightness which are caused by the large transmission resistance of the cathode of an OLED display device.

At least one embodiment of the present invention provides an OLED display device, which comprises a thin film transistor, a first electrode, a second electrode, an organic functional layer located between the first electrode and the second electrode, and a first auxiliary electrode formed from a topological insulator, wherein the thin film transistor comprises a gate electrode, a source electrode and a drain electrode; the first electrode is electrically connected with the drain electrode; and the first auxiliary electrode is electrically connected with the second electrode to provide electrical signals for the second electrode.

At least one embodiment of the present invention provides a method for preparing an OLED display device, which comprises: forming a thin film transistor, comprising forming a gate electrode, a source electrode and a drain electrode of the thin film transistor; forming a first electrode which is electrically connected with the drain electrode; forming an organic functional layer and forming a second electrode; forming a topological insulator into a first auxiliary electrode which is electrically connected with the second electrode, the first auxiliary electrode being configured for providing electrical signals for the second electrode.

At least one embodiment of the present invention provides a display apparatus, which comprises an array substrate and a package substrate, the array substrate and the package substrate being provided with any OLED display device as defined by the embodiments of the present invention.

BRIEF DESCRIPTION OF THE DRAWINGS

The present invention will become more fully understood from the detailed description given hereinafter and the accompanying drawings which are given by way of illustration only, and thus are not limitative of the present invention and wherein.

REFERENCE SIGNS ON THE FIGURES

10—package substrate; 11—second base substrate; 12—black matrix layer; 13—color filter layer; 14—over coat; 15—spacer; 20—array substrate; 21—first base substrate; 22—thin film transistor; 221—gate electrode; 222—source electrode; 223—drain electrode; 23—anode; 23'—first electrode; 24—pixel definition layer; 25—organic functional layer; 26—cathode; 26'—second electrode; 27—first auxiliary electrode; 28—second auxiliary electrode; 30—packed layer.

DETAILED DESCRIPTION

To make the object, technical solutions, and advantages of the embodiments of the present invention clearer, the technical solutions of the embodiments of the present invention will be described below in a clearer and complete way with reference to the figure of the embodiments of the present invention. Apparently, the embodiments described are only part, rather than all of the embodiments of the present invention. Based on the embodiments of the present invention described, all the other embodiments obtained by a person of ordinary skills in the art without paying inventive work fall into the scope of protection of the present invention.

Figure 1:
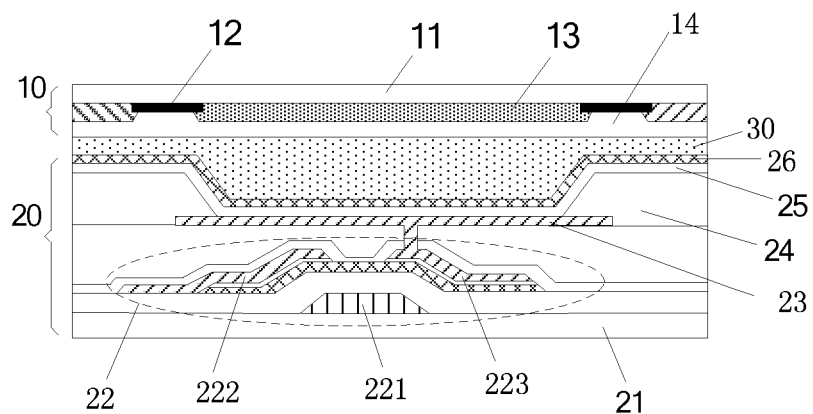
FIG. 1 is a schematic diagram of an OLED display apparatus.

An OLED display is shown in FIG. 1. The OLED display comprises an array substrate 20 and an package substrate 10 which are assembled. The array substrate 20 comprises a first base substrate 21, a thin layer transistor 22 comprising a gate electrode 221, a source electrode 222 and a drain electrode 223; an anode 23 connected with the drain electrode 223 of the thin layer transistor 22, an organic functional layer 25 located on the anode 23, a pixel definition layer 24 located between the anode 23 and the organic functional layer 25, and a cathode 26 located on the organic functional layer 25. The package substrate 10 comprises a second base substrate 11, a color filter layer 13, a black matrix layer 12 and an over coat 14. A packed layer (filler) 30 are arranged between the array substrate 20 and the package substrate 10. The organic functional layer 25 may be further classified into: hole transport layer (HTL), light emitting layer (EML), electron transport layer (ETL), etc.

As shown in FIG. 1, the cathode 26 of the OLED display is typically made of a thin layer of metallic silver, and the anode 23 is typically made of indium tin oxide (ITO). The inventor found that both thin layer metallic silver and ITO have a high electrical resistivity. Especially for large area formed cathode 26, the cathode prepared from a thin layer of metallic silver has a relatively high cathode electrical resistivity and a relatively high internal resistance drop (IR drop), resulting in a relatively great difference between the actual driving voltage of the OLED device and the supply voltage. Thus in a large-scale OLED display, there would be a large area with non-uniform lightness, and the display effect would be influenced.

A topological insulator is a new physical state recognized in recent years. The topological insulator has a bulk energy band structure that is the same as a bulk energy band structure of ordinary insulators, that is, an energy gap of a limited size exists at the Fermi energy level. However, on the boundary or the surface of a topological insulator, a Dirac type spin non-degeneration electro-conductive marginal state without an energy gap exists; this state is a unique property different from the ordinary insulators. Moreover, this electro-conductive marginal state exists stably. Information may be transmitted by the spin of an electron, rather than by electric charge like conventional materials. Therefore, a topological insulator has a better electro-conductive performance and is not dissipative, that is, does not generate heat.

Figure 2:
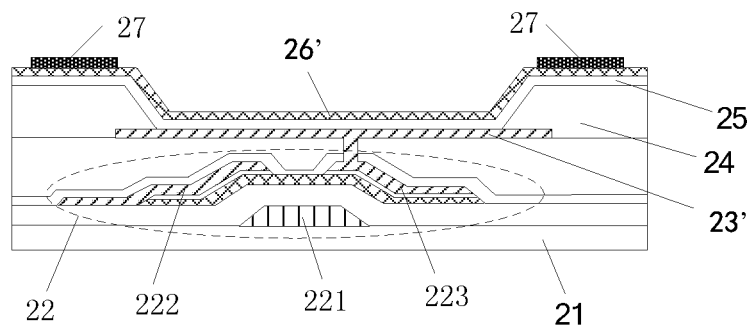
FIG. 2 is a schematic diagram of an OLED display device provided by an embodiment of the present invention.

At least one embodiment of the present invention provides an OLED display device. As shown in FIG. 2, the OLED display device comprises: a thin layer transistor 22, a first electrode 23' (such as anode), a second electrode 26' (such as cathode) and an organic functional layer 25 located between the first electrode 23' and the second electrode 26'. The thin film transistor 22 comprises a gate electrode 221, a source electrode 222 and a drain electrode 223. The first electrode 23' is electrically connected with the drain electrode 223.

The display further comprises a first auxiliary electrode 27 formed by a topological insulator. The first auxiliary electrode 27 is electrically connected with the second electrode 26' for providing electrical signals for the second electrode 26'.

For example, the first electrode 23' and the second electrode 26' are an anode and a cathode, respectively. That is, when the first electrode 23' is anode, the second electrode 26' is a cathode; or alternatively, when the first electrode 23' is cathode, the second electrode 26' is an anode. The present invention does not specially limit that. The embodiments of the present invention, as shown in FIG. 2, are explained in detail by taking the first electrode 23' being an anode and the second electrode 26' being a cathode for example.

In an OLED display device provided by the embodiments of the present invention, a first auxiliary electrode is formed by a topological insulator, and electrical signals are provided for the second electrode by the first auxiliary electrode in favor of reducing the IR drop of the second electrode and thereby making the display brightness uniform. Moreover, the topological insulator does not result in heat generation upon long-term conducting, which is beneficial to the long-term display of the display.

The thin film transistor comprises a gate electrode, a source electrode and a drain electrode. Thin film transistors can be classified into two types according to the position relations of these electrodes. The first type is the thin film transistor 22 as shown in FIG. 2, in which the gate electrode 221 is located below the source electrode 222 and the drain electrode 223, thus this type is known as the bottom-gate thin film transistor. In the other type, the gate electrode is located above the source electrode and the drain electrode, thus this type is known as the top-gate thin film transistor. The thin film transistor of the display device provided by at least one embodiment of the present invention may be a bottom-gate or top-gate thin film transistor. As shown in FIG. 2, the embodiments of the present invention are explained in detail by taking the thin film transistor 22 being a bottom-gate thin film transistor for example.

For example, the first auxiliary electrode 27 is a topological insulator with a two-dimensional nanostructure. The topological insulator with a two-dimensional nanostructure is a film with a nanoscale thickness formed from the topological insulator, and may be a two-dimensional nanoscale film, a two-dimensional nanoscale sheet, a two-dimentional nanoscale tape, etc. formed by the topological insulator. The topological insulator with a two-dimensional nanostructure has an ultrahigh specific surface area and an adjustable energy band structure, can reduce the proportion of bulk carriers and highlight the topological surface state significantly, and thus has a better electro-conductive performance.

What needs to be explained is that the topological insulator with a two-dimensional nanostructure has a similar structure as graphene and thus has a relative high flexibility and a high transmissibility which is substantially invisible to naked eyes; therefore it is very suitable for a display device.

For example, the topological insulator comprises at least one of HgTe, $Bi_xSb_{1-x}$, $Sb_2Te_3$, $Bi_2Te_3$, $Bi_2Se_3$, $TlBiTe_2$, $TlBiSe_2$, $Ge_1Bi_4Te_7$, $Ge_2Bi_2Te_5$, $Ge_1Bi_2Te_4$, AmN, PuTe, monolayer tin and a variant material of monolayer tin.

$Ge_1Bi_4Te_7$, $Ge_2Bi_2Te_5$ and $Ge_1Bi_2Te_4$ belong to chalcogenides. AmN and PuTe belong to a topological insulator with a strong interaction. Of course, the topological insulator also may be a ternary Heusler's compound or other material.

For example, the topological insulator may comprise at least one of HgTe, $Bi_xSb_{1-x}$, $Sb_2Te_3$, $Bi_2Te_3$, $Bi_2Se_3$, $TlBiTe_2$, $TlBiSe_2$, $Ge_1Bi_4Te_7$, $Ge_2Bi_2Te_5$, $Ge_1Bi_2Te_4$, AmN, PuTe, monolayer tin, and a variant material of monolayer tin. That is, the topological insulator may be HgTe or $Bi_xSb_{1-x}$, or $Sb_2Te_3$ or $Bi_2Te_3$ or $Bi_2Se_3$ or $TlBiTe_2$ or $TlBiSe_2$ or $Ge_1Bi_4Te_7$ or $Ge_2Bi_2Te_5$ or $Ge_1Bi_2Te_4$ or AmN or PuTe or monolayer tin or a variant material of monolayer tin. Alternatively, the topological insulator may be a mixed material formed from two or more of the above materials, such as, may be mixed materials formed from two of the above materials. Of course, the topological insulator may be a mixed material formed from three of the above materials, etc. Furthermore, when the topological insulator is a mixed material formed from at least two of the above materials, materials having complementary properties may be selected to be mixed, thereby improving the property of the mixed material.

For example, the topological insulator may be monolayer tin or a variant material of monolayer tin. Monolayer tin is a two-dimensional material having a thickness of only one tin atom. The atom layer thickness provides monolayer tin with a better light transmissibility. Similar as graphene, monolayer tin has better tenacity and high transmissibility.

The electrical conductivity of a monolayer of tin atoms can reach 100% at room temperature, thus the monolayer tin atoms can become a super conductor material. Specifically, the variant material of monolayer tin is formed by surface-modifying or magnetic-doping the monolayer tin. The surface-modifying of monolayer tin may be adding a functional group such as —F, —Cl, —Br, —I, —OH and the like to monolayer tin to achieve the modification.

The variant material of the monolayer tin is tin fluorine compound formed by surface-modifying the monolayer tin with fluorine (F) atoms. When fluorine atoms are added into the atomic structure of the monolayer tin, the electrical conductivity of the monolayer tin can reach 100% at a temperature up to 100° C., while the property of the monolayer tin is still stable.

In at least one embodiment of the present invention, as shown in FIG. 2, the first auxiliary electrode 27 is strip-shaped, and the display device comprises a plurality of first auxiliary electrode strips 27.

Electrical signals are provided for the second electrode by the plurality of first auxiliary electrode strips respectively, thereby the IR drop of the second electrode may be reduced. Of course, the auxiliary electrode also may a planar electrode. Because the transmission resistance of the auxiliary electrode is lower than that of the second electrode, the IR drop of the second electrode is also reduced.

Figure 3:
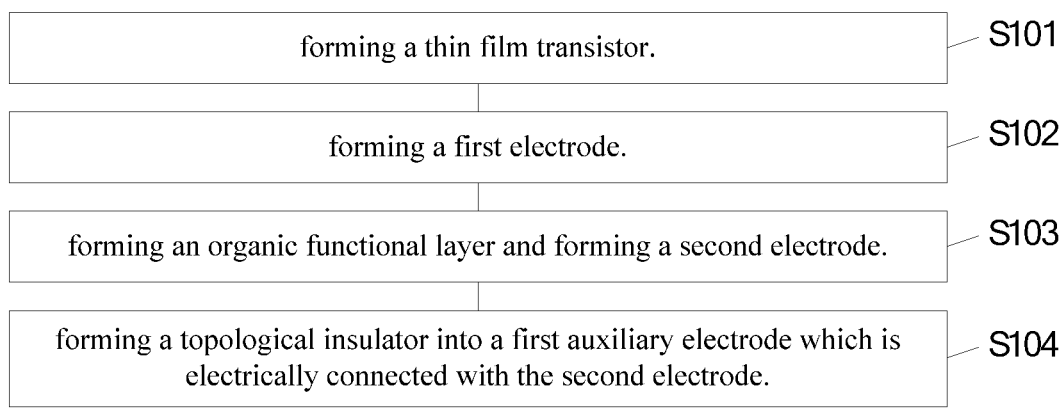
FIG. 3 is a schematic diagram of a method for preparing an OLED display device provided by an embodiment of the present invention.

At least one embodiment of the present invention provides a method for preparing an OLED display device. As shown in FIG. 3, the method comprises:

Step 101: forming a thin film transistor.

Forming a thin film transistor comprises forming a gate electrode, a source electrode and a drain electrode. When the thin film transistor is bottom-gate thin film transistor, the gate electrode is formed firstly, and then the source electrode and the drain electrode are formed on the gate electrode. When the thin film transistor is top-gate thin film transistor, the source electrode and the drain electrode are formed firstly, and then the gate electrode is formed on the source electrode and the drain electrode.

Step 102: forming a first electrode.

The first electrode is electrically connected with the drain electrode. For example, the first electrode may be an anode and may generally be formed by ITO.

Step 103: forming an organic functional layer and forming a second electrode.

The first electrode and the second electrode are an anode and a cathode, respectively. When the first electrode is anode, the second electrode is cathode. The cathode may generally be formed by metallic silver.

Forming the organic functional layer may be forming a hole transport functional layer (HTL layer), a hole injection functional layer (HIL layer), a light emitting functional layer (EML layer), a electron transport functional layer (ETL layer) and a electron injection functional layer (EIL layer) successively, which needs not to be further described in the embodiments of the present invention.

Step 104: forming a topological insulator into a first auxiliary electrode which is electrically connected with the second electrode.

The first auxiliary electrode is used for providing electrical signals for the second electrode.

Figure 4:
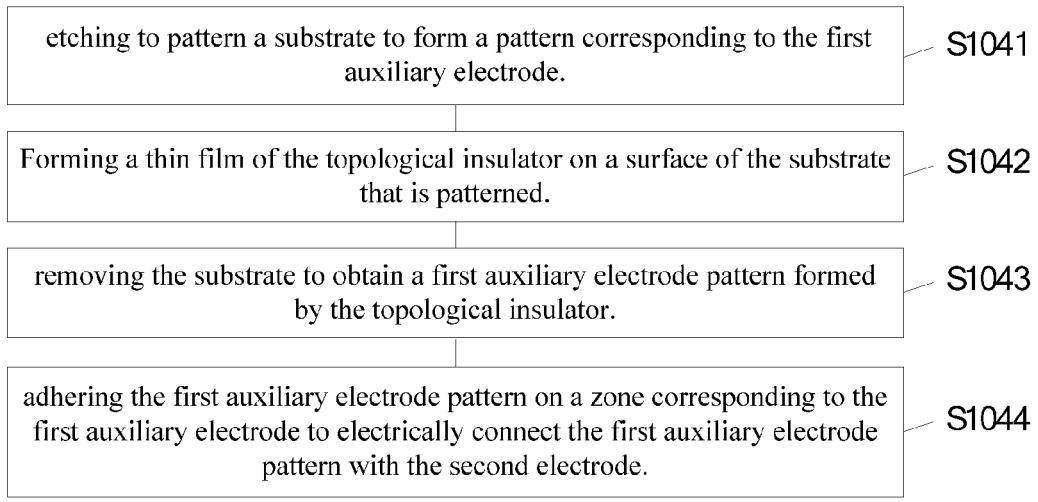
FIG. 4 is a schematic diagram of a method for preparing an first auxiliary electrode provided by an embodiment of the present invention.

For example, as shown in FIG. 4, the above step 104 comprises:

Step 1041: etching to pattern a substrate to form a pattern corresponding to the first auxiliary electrode.

Such as, the substrate may be mica or $SrTiO_3$ (111) or other substrate on the surface of which a topological insulator thin film can be grown by molecular beam epitaxy method. In this embodiment, the substrate is explained in detail by taking mica for example.

For example, Pattern etching the substrate to form a pattern corresponding to the first auxiliary electrode may be plasma etching the mica substrate under the masking of a mask plate which has the same shape as the pattern of the first auxiliary electrode, to obtain a mica substrate which has been patterned in correspondence to the pattern of the first auxiliary electrode.

Step 1042: forming a thin film of the topological insulator on a surface of the substrate that is patterned.

For example, a thin film of $Bi_2Se_3$ is grown on the surface of the patterned mica substrate by molecular beam epitaxy method. Of course, other topological insulator thin films can also be grown. In the embodiments of the present invention, the topological insulator is explained in detail by taking $Bi_2Se_3$ for example.

Step 1043: removing the substrate to obtain a first auxiliary electrode pattern formed by the topological insulator.

For example, the mica substrate is dissolved to obtain a first auxiliary electrode pattern formed by the topological insulator.

Step 1044: adhering the first auxiliary electrode pattern on a zone corresponding to the first auxiliary electrode to electrically connect the first auxiliary electrode pattern with the second electrode.

For example, the first auxiliary electrode pattern is adhered on a zone corresponding to the first auxiliary electrode to electrically connect the first auxiliary electrode with the second electrode. For instance, an adhesion layer can be formed on the surface of one side of the first auxiliary electrode and the first auxiliary electrode is adhered on the zone of the first auxiliary electrode to electrically connect the first auxiliary electrode with the second electrode.

Of course, the method for preparing the first auxiliary electrode is not limited to the above steps. The embodiments of the present invention are explained in detail by taking the above just for example.

Figure 5:
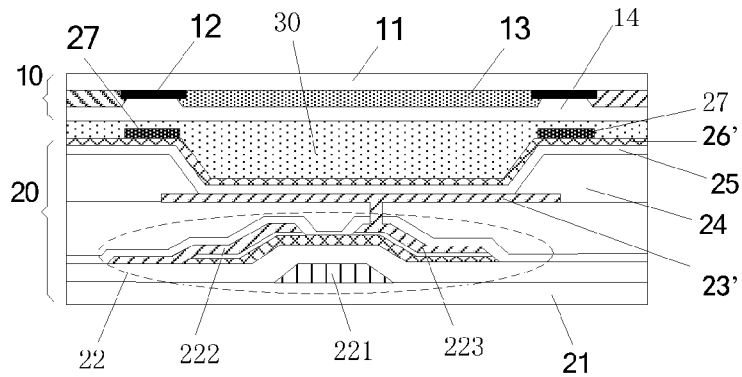
FIG. 5 is a schematic diagram of an OLED display apparatus provided by an embodiment of the present invention.

At least one embodiment of the present invention provides a display apparatus. As shown in FIG. 5, the display apparatus comprises an array substrate 20 and an package substrate 10, wherein, the array substrate 20 and the package substrate 10 are provided with the OLED display device provided by any of the embodiments of the present invention.

What needs to be explained is that a packed layer 30 is arranged on one side between the array substrate 20 and the package substrate 10. The packed layer 30 may be used for relieving the pressure between the substrates.

In at least one embodiment of the present invention, as shown in FIG. 5, a thin film transistor 22, a first electrode (anode 23), a second electrode (cathode 26), an organic functional layer 25 and a first auxiliary electrode 27 are formed on the array substrate 20, and the first auxiliary electrode 27 is formed on the second electrode 26' (cathode), directly contacts the second electrode 26' (cathode), and is electrically connected with the second electrode 26' (cathode).

What needs to be explained is that a plurality of first auxiliary electrode strips 27 may be directly formed on the second electrode for providing electrical signals for the second electrode by the first auxiliary electrodes to reduce the IR drop of the second electrode. The first auxiliary electrode as shown in FIG. 5 is a strip electrode, and may also be, of course, a planar electrode.

The terms "upper" and "lower" in the embodiments of the present invention indicate the time sequence when preparing a thin film or a pattern. For example, an upper thin film or pattern refers to the thin film or pattern formed later, while a lower thin film or pattern refers to the thin film or pattern formed earlier.

Figure 6:
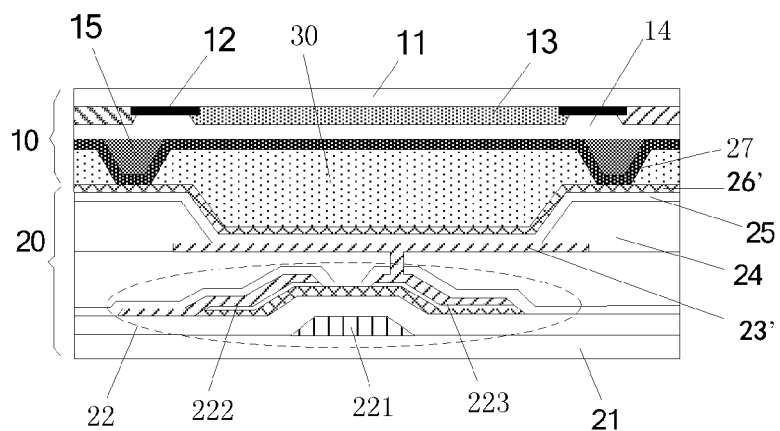
FIG. 6 is a schematic diagram of another OLED display apparatus provided by an embodiment of the present invention.

In at least one embodiment of the present invention, as shown in FIG. 6, a thin film transistor 22, a first electrode 23' (anode), a second electrode 26' (cathode) and an organic functional layer 25 are formed on the array substrate 20, and the first auxiliary electrode 27 is formed on the package substrate 10.

As shown in FIG. 6, the package substrate 10 comprises a second base substrate 11, and a color filter layer 13 formed on the second base substrate 11, a black matrix layer 12, a over coat 14 and a spacer 15. The first auxiliary electrode is formed on the package substrate 10 and may be formed, as shown in FIG. 6, on the over coat 14. What needs to be explained is that a spacer may generally also formed on the package substrate. When the first auxiliary electrode is strip-shaped, the first auxiliary electrodes are alternated with the spacer to reduce the thickness of the package substrate.

Figure 7:
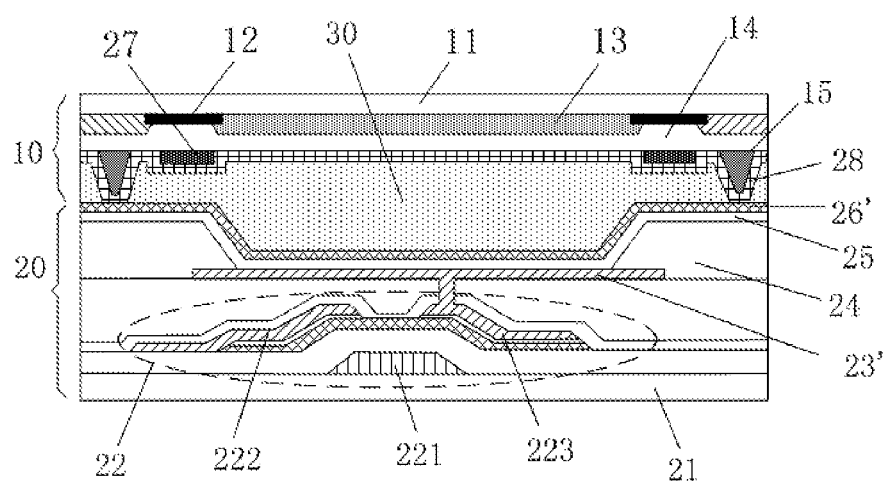
FIG. 7 is a schematic diagram of another OLED display apparatus provided by an embodiment of the present invention.

As shown in FIG. 7, the spacer is formed on the over coat 14. When the first auxiliary electrode 27 is formed on the over coat 14, the first auxiliary electrode 27 and the spacer 15 are located in the same layer in an alternative mode.

Of course, the first auxiliary electrode 27 may also be formed below the over coat 14 or directly formed on the second base substrate 11 and then electrically connected with the second electrode 26' (cathode) through holes. The embodiments of the present invention are explained in detail just by taking those shown in FIGS. 6-7 for example.

The first auxiliary electrode 27 as shown in FIG. 6 is a planar electrode, and may also be, of course, a strip electrode.

For example, as shown in FIG. 7, a second auxiliary electrode 28 is also formed on the package substrate 10. When the first auxiliary electrode 27 is strip-shaped, it is electrically connected with the second electrode 26' (cathode) through the second auxiliary electrode 28.

For example, as shown in FIG. 5 and FIG. 7, a black matrix 12 is formed on the package substrate 10. When the first auxiliary electrode 27 is strip-shaped, the first auxiliary electrode 27 is located at a position corresponding to the black matrix 12.

Of course, the first transparent auxiliary electrode formed by the topological insulator may also be located at a position corresponding to the zone of the color filter layer between the black matrices. The embodiments of the present invention are explained in detail just by taking the first auxiliary electrode preferably located at the position corresponding to the black matrix for example.

The above description is merely exemplary embodiments which are not used for limiting the scope of protection of the present invention which is, however, determined by the attached claims.

The present application claims the priority of the Chinese Patent Application No. 201410381736.8 submitted on Aug. 5, 2014, and the content disclosed in the above Chinese patent application is incorporated by reference as part of this application.

What is claimed is:

1. An organic light emitting diode (OLED) display device, comprising a thin film transistor, a first electrode, a second electrode, an organic functional layer located between the first electrode and the second electrode, and a first auxiliary electrode formed from a topological insulator, the topological insulator is a material having an insulator energy gap in its bulk and a Dirac type spin non-degeneration electro-conductive marginal state without an energy gap on its boundary or surface;

wherein, the thin film transistor comprises a gate electrode, a source electrode and a drain electrode; the first electrode is electrically connected with the drain electrode;

the first auxiliary electrode is electrically connected with the second electrode to provide electrical signals for the second electrode; and wherein the topological insulator comprises at least one selected from the group consisting of $HgTe$, $Bi_xSb_{1-x}$, $Sb_2Te_3$, $Bi_2Te_3$, $Bi_2Se_3$, $TlBiTe_2$, $TlBiSe_2$, $Ge_1Bi_4Te_7$, $Ge_2Bi_2Te_5$, $Ge_1Bi_2Te_4$, $AmN$, $PuTe$, monolayer tin and a variant material of monolayer tin, wherein the variant material of monolayer tin is formed by surface-modifying or magnetic-doping the monolayer tin through adding a functional group such as —F, —Cl, —Br, —I and —OH.

2. The display device as defined according to claim 1, wherein the first electrode and the second electrode are an anode and a cathode, respectively.

3. The display device as defined according to claim 1, wherein the variant material of monolayer tin is a tin fluorine compound formed by surface-modifying monolayer tin with fluorine atom.

4. The display device as defined according to claim 1, wherein the first auxiliary electrode is strip-shaped, and the display device comprises a plurality of the first auxiliary electrode strips.

5. A display apparatus, comprising an array substrate and a package substrate, the array substrate and the package substrate being provided with an organic light emitting diode (OLED) display device, wherein the OLED display device comprises a thin film transistor, a first electrode, a second electrode, an organic functional layer located between the first electrode and the second electrode, and a first auxiliary electrode formed from a topological insulator, the topological insulator is a material having an insulator energy gap in its bulk and a Dirac type spin non-degeneration electro-conductive marginal state without an energy gap on its boundary or surface, wherein, the thin film transistor comprises a gate electrode, a source electrode and a drain electrode; the first electrode is electrically connected with the drain electrode; and the first auxiliary electrode is electrically connected with the second electrode to provide electrical signals for the second electrode; and wherein the topological insulator comprises at least one selected from the group consisting of $HgTe$, $Bi_xSb_{1-x}$, $Sb_2Te_3$, $Bi_2Te_3$, $Bi_2Se_3$, $TlBiTe_2$, $TlBiSe_2$, $Ge_1Bi_4Te_7$, $Ge_2Bi_2Te_5$, $Ge_1Bi_2Te_4$, $AmN$, $PuTe$, monolayer tin and a variant material of monolayer tin, wherein the variant material of monolayer tin is formed by surface-modifying or magnetic-doping the monolayer tin through adding a functional group such as —F, —Cl, —Br, —I and —OH.

6. The display apparatus as defined according to claim 5, wherein the thin film transistor, the first electrode, the second electrode, the organic functional layer and the first auxiliary electrode are formed on the array substrate, and the first auxiliary electrode is formed on the second electrode, directly contacts the second electrode and is electrically connected with the second electrode.

7. The display apparatus as defined according to claim 6, wherein a black matrix is formed on the package substrate; and upon the first auxiliary electrode is strip-shaped, the first auxiliary electrode is located at a position corresponding to the black matrix.

8. The display apparatus as defined according to claim 5, wherein the thin film transistor, the first electrode, the second electrode and the organic functional layer are formed on the array substrate; and the first auxiliary electrode is formed on the package substrate.

9. The display apparatus as defined according to claim 8, wherein a second auxiliary electrode is also formed on the package substrate; and upon the first auxiliary electrode is strip-shaped, the first auxiliary electrode is electrically connected with the second electrode through the second auxiliary electrode.

10. The display apparatus as defined according to claim 8, wherein a black matrix is formed on the package substrate; and upon the first auxiliary electrode is strip-shaped, the first auxiliary electrode is located at a position corresponding to the black matrix.

11. The display apparatus as defined according to claim 5, wherein a black matrix is formed on the package substrate; and upon the first auxiliary electrode is strip-shaped, the first auxiliary electrode is located at a position corresponding to the black matrix.

12. A method for preparing an organic light emitting diode (OLED) display device, comprising:
    forming a thin film transistor, comprising a gate electrode, a source electrode and a drain electrode of the thin film transistor;
    forming a first electrode which is electrically connected with the drain electrode;
    forming an organic functional layer and a second electrode, the organic functional layer located between the first electrode and the second electrode;
    forming a topological insulator into a first auxiliary electrode which is electrically connected with the second electrode, the first auxiliary electrode being configured for providing electrical signals for the second electrode,
    wherein the topological insulator is a material having an insulator energy gap in its bulk and a Dirac type spin non-degeneration electro-conductive marginal state without an energy gap in its boundary or surface,
    wherein the topological insulator comprises at least one selected from the group consisting of HgTe, $Bi_xSb_{1-x}$, $Sb_2Te_3$, $Bi_2Te_3$, $Bi_2Se_3$, $TlBiTe_2$, $TlBiSe_2$, $Ge_1Bi_4Te_7$, $Ge_2Bi_2Te_5$, $Ge_1Bi_2Te_4$, AmN, PuTe, monolayer tin and a variant material of monolayer tin, and
    wherein the variant material of monolayer tin is formed by surface-modifying or magnetic-doping the monolayer tin through adding a functional group such as —F, —Cl, —Br, —I and —OH.

13. The method as defined according to claim 12, wherein forming of a topological insulator into a first auxiliary electrode which is electrically connected with the second electrode comprises:
    etching to pattern a substrate to form a pattern corresponding to the first auxiliary electrode;
    forming a thin film of the topological insulator on a surface of the substrate that is patterned;
    removing the substrate to obtain a first auxiliary electrode pattern formed by the topological insulator; and
    adhering the first auxiliary electrode pattern on a zone corresponding to the first auxiliary electrode to electrically connect the first auxiliary electrode pattern with the second electrode.

14. The method as defined according to claim 13, wherein the first electrode and the second electrode are an anode and a cathode, respectively.

15. The method as defined according to claim 12, wherein the first electrode and the second electrode are an anode and a cathode, respectively.

\* \* \* \* \*